(12) United States Patent
Hayashi et al.

(10) Patent No.: US 10,123,457 B2
(45) Date of Patent: Nov. 6, 2018

(54) COOLING APPARATUS AND ELECTRONIC DEVICE

(71) Applicant: FUJITSU LIMITED, Kawasaki-shi, Kanagawa (JP)

(72) Inventors: Nobuyuki Hayashi, Yokohama (JP); Teru Nakanishi, Isehara (JP); Takahiro Kimura, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/606,166

(22) Filed: May 26, 2017

(65) Prior Publication Data

US 2017/0265330 A1    Sep. 14, 2017

Related U.S. Application Data

(63) Continuation of application No. PCT/JP2015/053554, filed on Feb. 9, 2015.

(51) Int. Cl.
*H05K 7/20* (2006.01)
*H01L 23/427* (2006.01)
(Continued)

(52) U.S. Cl.
CPC ..... *H05K 7/20381* (2013.01); *F28D 15/0266* (2013.01); *F28D 15/06* (2013.01);
(Continued)

(58) Field of Classification Search
CPC . F28D 15/0266; F28D 15/06; H05K 7/20309; H01L 23/427
See application file for complete search history.

(56) References Cited

U.S. PATENT DOCUMENTS 1,956,977 A * 5/1934 Shawn ............... G05D 16/0672
137/488
3,100,502 A * 8/1963 Ford ...................... F16K 17/08
137/469
(Continued)

FOREIGN PATENT DOCUMENTS

DE    102009025010    *    2/2010    ............... F01N 5/02
JP      04045393      *    2/1992
(Continued)

OTHER PUBLICATIONS

International Search Report for International Application No. PCT/JP2015/053554 dated May 12, 2015 (2 Sheets).
(Continued)

*Primary Examiner* — Robert J Hoffberg
(74) *Attorney, Agent, or Firm* — Kratz, Quintos & Hanson, LLP

(57) ABSTRACT

A cooling apparatus includes: an evaporator in which a coolant is housed and that evaporates the coolant; a condenser that condenses the coolant evaporated by the evaporator; a pathway section that includes a vapor path and a liquid path each placing the inside of the evaporator and the inside of the condenser in communication with each other, and that circulates the coolant between the evaporator and the condenser; a valve that is provided to at least one path out of the vapor path or the liquid path; and a pressure regulation section that increases an opening amount of the valve according to an increase in pressure inside the evaporator.

8 Claims, 7 Drawing Sheets

(51) Int. Cl.
  *F28D 15/02* (2006.01)
  *F28D 15/06* (2006.01)
  *F28F 27/00* (2006.01)
  *H01L 23/34* (2006.01)

(52) U.S. Cl.
  CPC .............. *F28F 27/00* (2013.01); *H01L 23/34* (2013.01); *H01L 23/427* (2013.01); *H05K 7/20309* (2013.01); *H05K 7/20318* (2013.01); *H05K 7/20727* (2013.01); *H05K 7/20809* (2013.01); *F28F 2265/12* (2013.01)

(56) References Cited

U.S. PATENT DOCUMENTS

| | | | | |
|---|---|---|---|---|
| 3,404,730 | A * | 10/1968 | Kurisu | F28D 15/0266 165/104.33 |
| 3,616,783 | A * | 11/1971 | Masters | F02M 25/0836 123/518 |
| 3,962,529 | A * | 6/1976 | Kubo | H01B 7/29 165/104.21 |
| 4,301,831 | A * | 11/1981 | Lord | G05D 16/163 137/487 |
| 4,974,667 | A * | 12/1990 | Sun | B60H 1/025 165/274 |
| 5,535,818 | A | 7/1996 | Fujisaki | |
| 5,816,287 | A * | 10/1998 | Hyodo | B60K 15/03519 137/587 |
| 6,415,858 | B1 * | 7/2002 | Getchel | B23Q 11/126 165/101 |
| 6,752,169 | B2 * | 6/2004 | Callies | F16K 17/0413 137/495 |
| 6,923,205 | B2 * | 8/2005 | Callies | F16K 17/0413 137/495 |
| 7,877,991 | B2 * | 2/2011 | Miyagawa | F01N 5/02 165/41 |
| 7,946,112 | B2 * | 5/2011 | Miyagawa | F01N 3/043 165/272 |
| 8,069,906 | B2 * | 12/2011 | Mukoubara | B60H 1/20 165/104.21 |
| 8,316,927 | B2 * | 11/2012 | Kohara | F01N 5/02 165/104.21 |
| 8,333,068 | B2 * | 12/2012 | Muramatsu | F01N 3/0205 60/320 |
| 8,910,701 | B2 * | 12/2014 | Torres Sep Iveda | B64G 1/50 165/103 |
| 2007/0075284 | A1 | 4/2007 | Masamura | |
| 2007/0137851 | A1 * | 6/2007 | Hamada | F01N 5/02 165/274 |
| 2007/0289721 | A1 * | 12/2007 | Miyagawa | F28D 15/0266 165/104.21 |
| 2008/0011458 | A1 * | 1/2008 | Miyagawa | F01N 5/02 165/104.21 |
| 2009/0000285 | A1 * | 1/2009 | Miyagawa | B60H 1/00571 60/320 |
| 2011/0131962 | A1 | 6/2011 | Toi | |
| 2012/0230657 | A1 * | 9/2012 | Uno | B60H 1/00385 392/308 |
| 2012/0234420 | A1 | 9/2012 | Matsukawa | |

FOREIGN PATENT DOCUMENTS

| | | |
|---|---|---|
| JP | H06-125188 A | 5/1994 |
| JP | 2001-349681 A1 | 12/2001 |
| JP | 2005-155895 A1 | 6/2005 |
| JP | 2005-188813 A1 | 7/2005 |
| JP | 2006-13408 A1 | 1/2006 |
| JP | 2006-29672 A1 | 2/2006 |
| JP | 2008-303728 A1 | 12/2008 |
| JP | 2009-52757 A1 | 3/2009 |
| JP | 2010-59960 A1 | 3/2010 |
| JP | 2010-275999 A1 | 12/2010 |
| JP | 2011-69335 A1 | 4/2011 |

OTHER PUBLICATIONS

Written Opinion of the International Searching Authority for International Application No. PCT/JP2015/053554 dated May 12, 2015 (2 Sheets translation, 1 Sheet, 3 Sheets total).

Office Action of Japanese Patent Application No. 2016-574547 dated Mar. 6, 2018 (2 Sheets, 4 Sheets translation, 6 Sheets total).

* cited by examiner

COOLING APPARATUS AND ELECTRONIC DEVICE

CROSS-REFERENCE TO RELATED APPLICATION

This application is a continuation application of International Application No. PCT/JP/2015/053554, filed on Feb. 9, 2015, the disclosure of which is incorporated herein by reference in its entirety.

FIELD

Technology disclosed herein relates to a cooling apparatus and an electronic device.

BACKGROUND

Cooling apparatuses including an evaporator and a condenser, and a vapor tube and liquid tube connected to the evaporator and the condenser, have existed hitherto. In such cooling apparatuses, when a coolant inside the evaporator is vaporized by the heat of a heat generating body so as to generate vapor in the evaporator, the vapor is conveyed from the evaporator to the condenser through the vapor tube. In the condenser, the vapor conveyed through the vapor tube is liquefied, and the liquefied coolant in the condenser is returned from the condenser to the evaporator through the liquid tube. By circulating the coolant between the evaporator and the condenser as described above, the heat of the heat generating body is transported from the evaporator to the condenser by the coolant, thereby cooling the heat generating body.

This type of cooling apparatus includes cooling apparatuses in which a valve is provided to at least the vapor tube out of the vapor tube and the liquid tube. As an example of such a cooling apparatus provided with a valve, a cooling apparatus exists in which a valve is actuated according to a pressure difference between the interior and exterior of a circulation path around which the coolant circulates in order to regulate the coolant circulation rate, with the purpose of preventing the inside of the evaporator from drying out accompanying freezing of the liquid tube.

As another example of such a cooling apparatus provided with a valve, a cooling apparatus exists in which a valve is actuated according to the surface temperature of the evaporator in order to regulate the coolant circulation rate, with the purpose of preventing the inside of the evaporator from drying out accompanying a sudden rise in the temperature of the evaporator.

RELATED PATENT DOCUMENTS

Japanese Laid-Open Patent Publication No. 2006-13408
Japanese Laid-Open Patent Publication No. 2006-29672
Japanese Laid-Open Patent Publication No. H6-125188
Japanese Laid-Open Patent Publication No. 2005-188813

SUMMARY

According to an aspect of the embodiments, a cooling apparatus includes: an evaporator in which a coolant is housed and that evaporates the coolant; a condenser that condenses the coolant evaporated by the evaporator; a pathway section that includes a vapor path and a liquid path each placing the inside of the evaporator and the inside of the condenser in communication with each other, and that circulates the coolant between the evaporator and the condenser; a valve that is provided to at least one path out of the vapor path or the liquid path; and a pressure regulation section that increases an opening amount of the valve according to an increase in pressure inside the evaporator.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Exemplary Embodiment

First, explanation follows regarding a first exemplary embodiment of technology disclosed herein.

Figure 1:
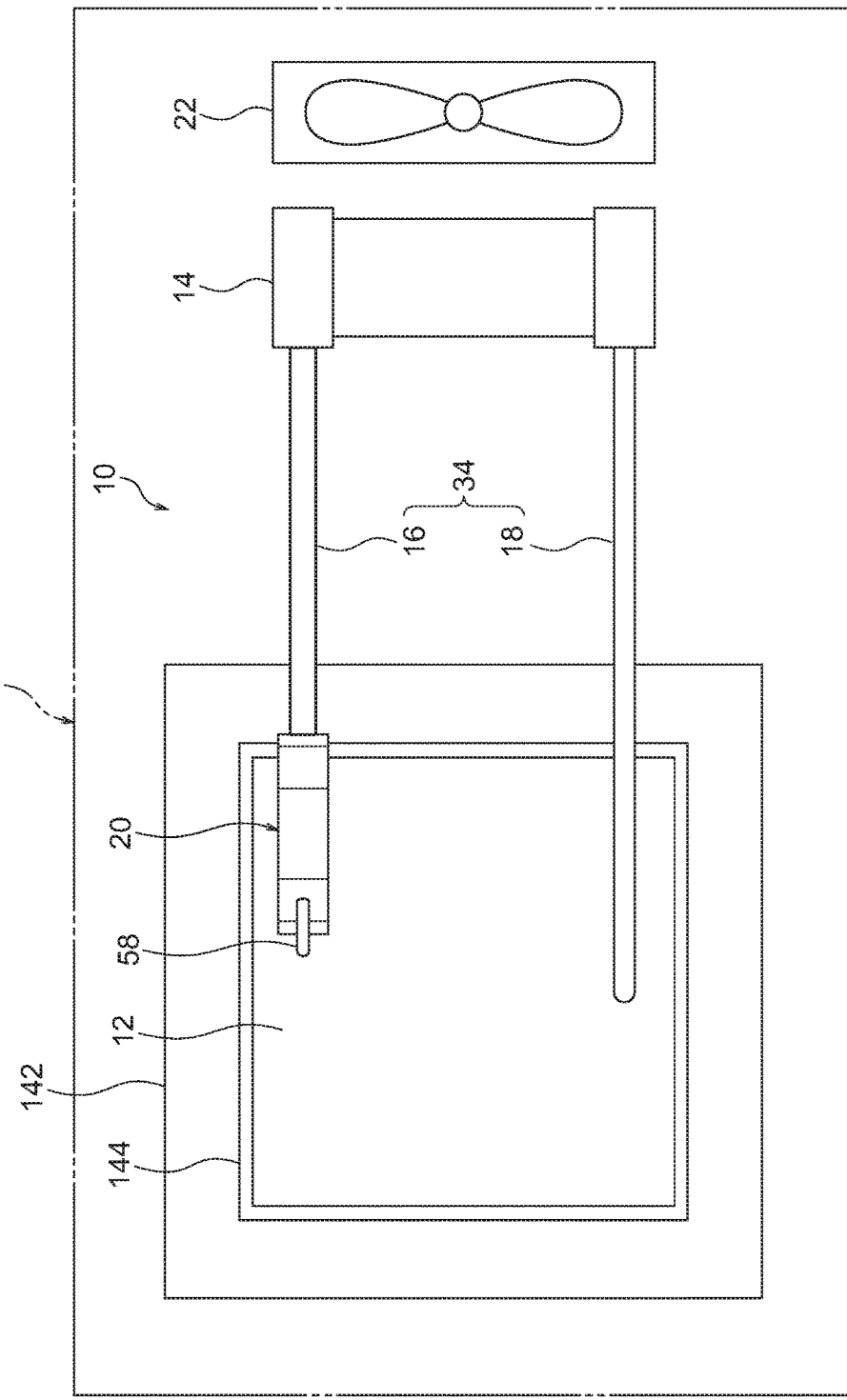
FIG. 1 is a plan view illustrating an electronic device provided with a cooling apparatus according to a first exemplary embodiment.
Figure 2:
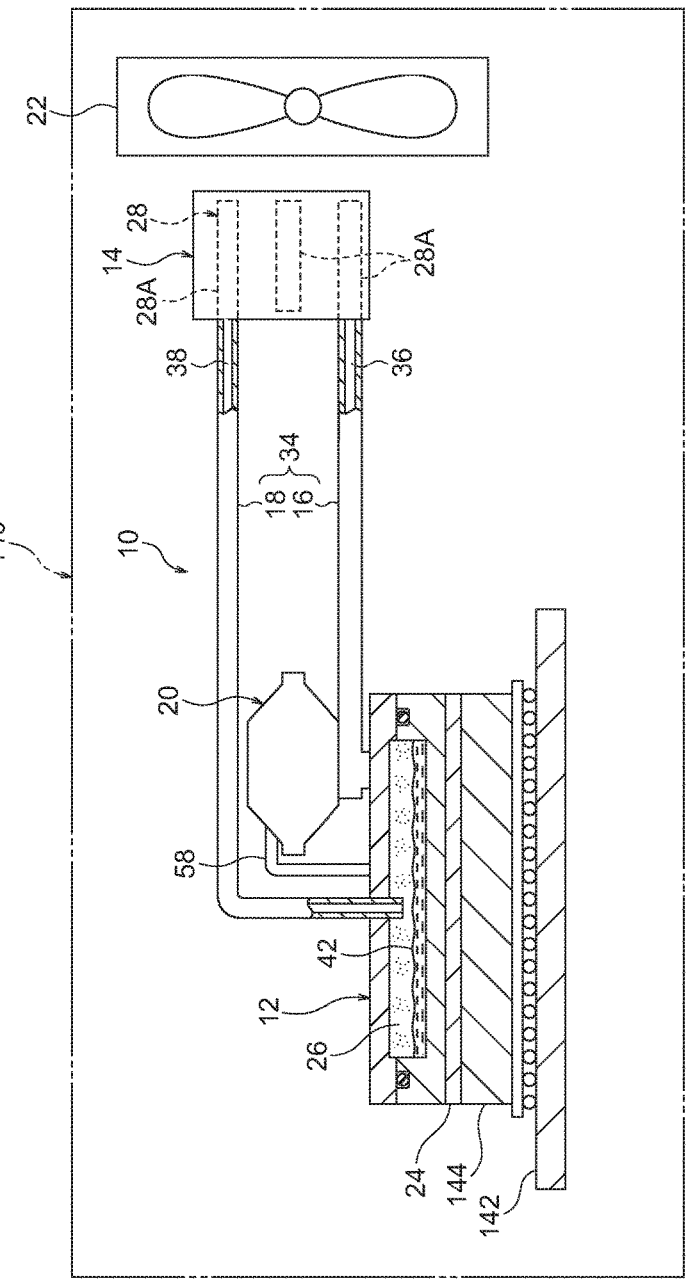
FIG. 2 is a side view illustrating an electronic device provided with a cooling apparatus according to the first exemplary embodiment.

An electronic device 140 illustrated in FIG. 1 and FIG. 2 is, for example, a server. The electronic device 140 includes a circuit board 142. The circuit board 142 is mounted with an electronic component 144, this being a heat generating body. The electronic component 144 is, for example, a semiconductor element such as a Central Processing Unit (CPU), and generates heat when running.

The electronic device 140 includes a cooling apparatus 10 to cool the electronic component 144 mentioned above. The cooling apparatus 10 includes an evaporator 12, a condenser 14, a vapor tube 16, a liquid tube 18, a pressure regulation mechanism 20, and a fan 22.

As illustrated in FIG. 2, the evaporator 12 is formed in a flattened box shape. The evaporator 12 is thermally connected to the electronic component 144 through a connecting member 24. An evaporation chamber 26 is formed inside the evaporator 12, and a condensation flow path 28 is formed inside the condenser 14. The condensation flow path 28 is formed so as to meander. The meandering condensation flow path 28 includes plural linear flow paths 28A. As an example, the plural linear flow paths 28A run alongside each other in a height direction of the condenser 14.

The evaporator 12 and the condenser 14 are connected together by the vapor tube 16 and the liquid tube 18. The vapor tube 16 and the liquid tube 18 form a pathway section 34. A vapor path 36 is formed inside the vapor tube 16, and a liquid path 38 is formed inside the liquid tube 18. The evaporation chamber 26 and the condensation flow path 28 are in communication with each other through the vapor path 36 and the liquid path 38. Regarding the vapor path 36 and the liquid path 38, an inlet port area of the vapor path 36 is set larger than an outlet port area of the liquid path 38, such that of the vapor path 36 and the liquid path 38, coolant vaporized in the evaporation chamber 26 flows through the vapor path 36 toward the condenser 14 side.

The evaporation chamber 26, the condensation flow path 28, the vapor path 36, and the liquid path 38 form a sealed loop-type circulation path. The circulation path is filled with a coolant 42 (operating fluid). The coolant 42 employs, for example, pure water, a liquid containing a mixture of pure water and ethanol, or a fluorine-based liquid. The circulation path may be filled with the coolant 42 at a reduced pressure or the circulation path may be filled with the coolant 42 at atmospheric pressure. The coolant 42 filled in the circulation path flows into the evaporation chamber 26, and is housed in the evaporation chamber 26.

The fan 22 is disposed adjacent to the condenser 14. The fan 22 forms a cooling airflow that cools the condenser 14 when running.

Figure 3:
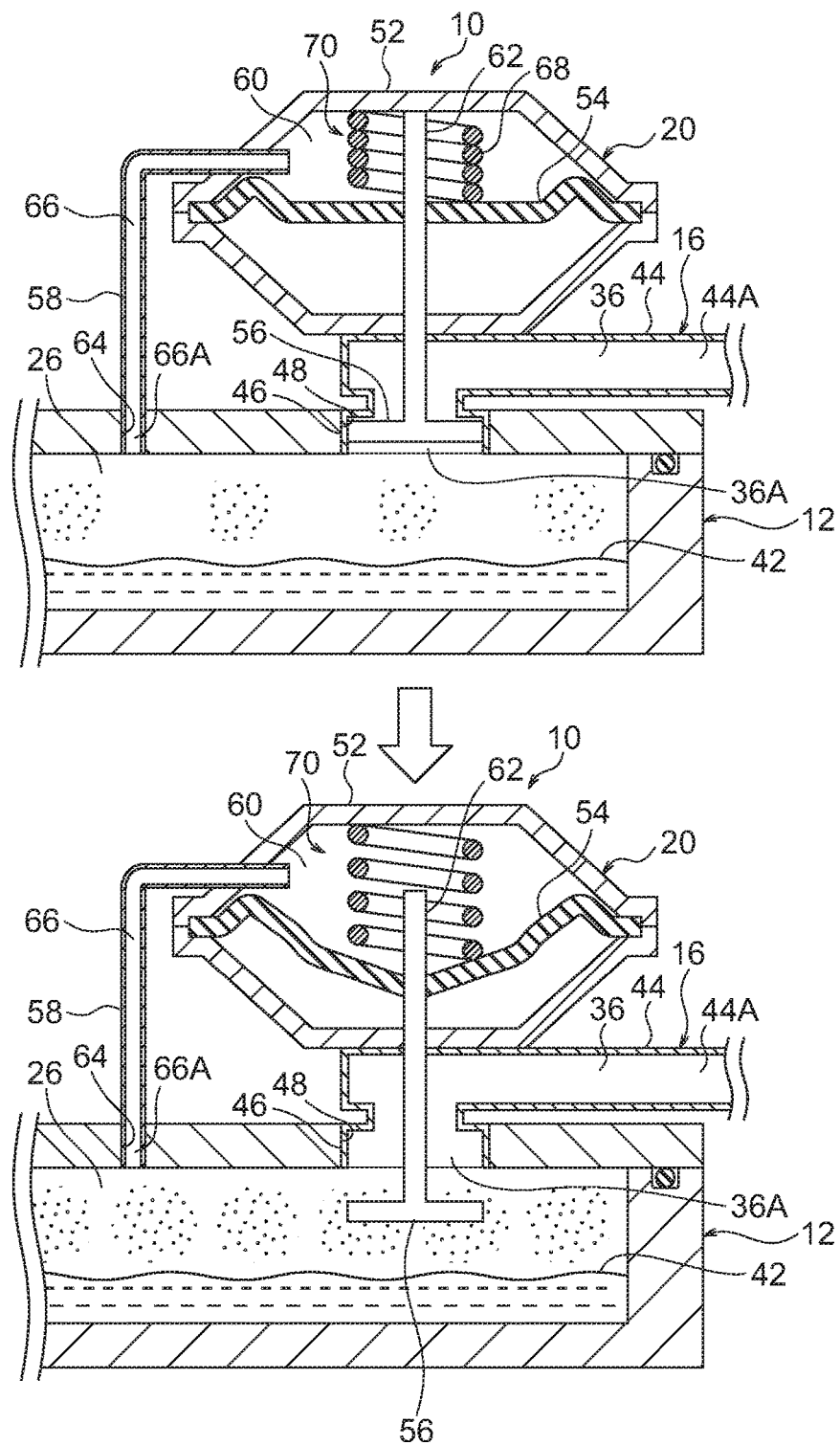
FIG. 3 is a diagram to explain configuration and operation of a pressure regulation mechanism according to the first exemplary embodiment.

FIG. 3 is a vertical cross-section specifically illustrating an evaporator 12 side end portion of the vapor tube 16 and the pressure regulation mechanism 20. The vapor tube 16 includes a general portion 44 extending in a straight line above the evaporator 12 and along a horizontal direction of the evaporator 12, and a connecting portion 46 that projects out from the evaporator 12 side end portion of the general portion 44 toward the evaporator 12 side. The connecting portion 46 is press-fitted into a connection hole 48 formed in an upper wall of the evaporator 12.

The pressure regulation mechanism 20 includes a vessel 52, a diaphragm 54, a valve 56, and a pressure transmission duct 58. The vessel 52 is fixed above the vapor tube 16 or the evaporator 12. There is a sealed space inside the vessel 52. The diaphragm 54 is formed from a material with elastic properties such as rubber, and is formed in a circular disk shape.

The diaphragm 54 is disposed with its thickness direction in the height direction of the vessel 52 and is provided at a central portion in the height direction of the vessel 52. The diaphragm 54 partitions the space inside the vessel 52 into upper and lower parts, and out of an upper side space and a lower side space inside the vessel 52 partitioned by the diaphragm 54, the upper side space configures a pressure-actuation space 60.

The pressure-actuation space 60 is provided independently of the vapor path 36, and is not in communication with the vapor path 36. Moreover, the pressure-actuation space 60 is provided independently of the liquid path 38 described above (see FIG. 2). A lower side wall of the pressure-actuation space 60 is formed by the diaphragm 54.

A coupling rod 62 extending in the height direction of the vessel 52 is fixed at a central portion of the diaphragm 54. A leading end side of the coupling rod 62 passes through a lower wall of the vessel 52 and an upper wall of the vapor tube 16 and is inserted inside the vapor path 36, and the valve 56 is provided at a leading end portion of the coupling rod 62. The inside of the connecting portion 46 configures an inlet port 36A of the vapor path 36, and the valve 56 is provided to the inlet port 36A of the vapor path 36 as an example of being at "an end portion on the evaporator side of the vapor path".

One end of the pressure transmission duct 58 is press-fitted into a connection hole 64 formed in the upper wall of the evaporator 12, and the other end of the pressure transmission duct 58 passes through an upper portion of a side wall of the vessel 52 and is inserted into the pressure-actuation space 60. A pressure transmission path 66 is formed inside the pressure transmission duct 58, and the evaporation chamber 26 and the pressure-actuation space 60 are placed in communication with each other through the pressure transmission path 66. The area of an inlet port 66A of the pressure transmission path 66 is smaller than the area of the inlet port 36A of the vapor path 36, such that when the pressure inside the evaporator 12 increases, vapor flows into the vapor path 36 more readily than into the pressure transmission path 66.

Moreover, an elastic member 68, such as a coil spring, is provided inside the pressure-actuation space 60. One end of the elastic member 68 is fixed to the diaphragm 54, and the other end of the elastic member 68 is fixed to an upper wall of the vessel 52.

In the first exemplary embodiment, the vessel 52, the diaphragm 54, the pressure transmission duct 58, the coupling rod 62, and the elastic member 68 described above form a pressure transmission section 70. The pressure transmission section 70 is an example of a "pressure regulation section". The pressure transmission section 70 is configured as a structure that regulates the opening amount of the valve 56 using pressure transmitted from inside the evaporator 12, as will be described later.

Namely, when the diaphragm 54 and the elastic member 68 are in free states as illustrated in the upper part of FIG. 3, the diaphragm 54 adopts a flat state. The length of the coupling rod 62 is set such that the valve 56 is contained in the inlet port 36A of the vapor path 36 when the diaphragm 54 is in the flat state. The external diameter of the valve 56 is slightly smaller than the internal diameter of the inlet port 36A of the vapor path 36, such that the opening amount of the valve 56 is small in the state in which the valve 56 is contained in the inlet port 36A of the vapor path 36.

On the other hand, as illustrated in the lower part of FIG. 3, in a state in which pressure has been transmitted from inside the evaporator 12 to the pressure-actuation space 60 through the pressure transmission path 66, as described later, and the pressure inside the pressure-actuation space 60 has increased, the diaphragm 54 is elastically deformed toward the lower side. In a state in which the diaphragm 54 has been elastically deformed toward the lower side, the valve 56 is moved to below the inlet port 36A of the vapor path 36. The opening amount of the valve 56 is increased due to the valve 56 being moved to below the inlet port 36A of the vapor path 36. The elastic moduli of the diaphragm 54 and the elastic member 68 are set to appropriate values for releasing pressure inside the evaporator 12, as described later.

In this manner, the pressure transmission section 70 is configured with a structure that utilizes pressure transmitted from inside the evaporator 12 through the pressure transmission path 66 to increase the opening amount of the valve 56 accompanying the increase in pressure.

Next, explanation follows regarding operation and advantageous effects of the first exemplary embodiment.

In the cooling apparatus 10 according to the first exemplary embodiment, when the electronic component 144 illustrated in FIG. 2 generates heat, the heat of the electronic component 144 is transmitted to the evaporator 12 through the connecting member 24. When the evaporator 12 is heated by the heat of the electronic component 144, the coolant 42 inside the evaporator 12 is vaporized, producing vapor inside the evaporator 12. This vapor is conveyed from the evaporator 12 to the condenser 14 through the vapor tube 16.

Moreover, when the electronic component 144 generates heat, the fan 22 is actuated. When the fan 22 is actuated, the cooling airflow that cools the condenser 14 is formed, and heat is released from the condenser 14. The vapor conveyed through the vapor tube 16 is liquefied in the condenser 14 that dissipates heat in this manner. The liquefied coolant 42 in the condenser 14 is returned from the condenser 14 to the evaporator 12 through the liquid tube 18.

By circulating the coolant 42 between the evaporator 12 and the condenser 14 as described above, the heat of the electronic component 144 is transported from the evaporator 12 to the condenser 14, thereby cooling the electronic component 144.

Note that an evaporation rate of the coolant 42 in the evaporator 12 increases accompanying an increase in the amount of heat generated by the electronic component 144. As the pressure inside the evaporator 12 rises, the boiling point of the coolant 42 inside the evaporator 12 also rises. Since the cooling function of the evaporator 12 is achieved primarily by evaporation of the coolant 42, there is a concern that a rise in the boiling point of the coolant 42 in the evaporator 12 could reduce the evaporation rate of the coolant 42 in the evaporator 12, resulting in a drop in cooling performance.

However, the cooling apparatus 10 according to the first exemplary embodiment is provided with the pressure regulation mechanism 20 (see FIG. 3). When the amount of heat generated by the electronic component 144 increases and the pressure inside the evaporator 12 becomes high, this pressure is transmitted from inside the evaporator 12 to the pressure-actuation space 60 through the pressure transmission path 66. Namely, some of the gas inside the evaporation chamber 26 flows through the pressure transmission path 66 into the pressure-actuation space 60.

When pressure is transmitted to the pressure-actuation space 60 in this manner, the pressure inside the pressure-actuation space 60 increases, and as illustrated in the upper and lower parts of FIG. 3, the diaphragm 54 is elastically deformed toward the lower side under the pressure inside the pressure-actuation space 60. When the diaphragm 54 is elastically deformed toward the lower side, the valve 56 is moved to below the inlet port 36A of the vapor path 36, and the opening amount of the valve 56 is increased.

Then, when the opening amount of the valve 56 is increased in this manner, the pressure inside the evaporator 12 is released, suppressing vapor from lingering inside the evaporator 12, and thus suppressing an excessive rise in pressure in the evaporator 12. The boiling point of the coolant 42 inside the evaporator 12 can be suppressed from rising as a result, enabling the evaporation rate of the coolant 42 to be secured, and enabling the cooling performance of the cooling apparatus 10 to be improved.

The electronic component 144 is also cooled utilizing latent heat when the coolant 42 is vaporized in the evaporator 12. The cooling performance of the cooling apparatus 10 can therefore be even more effectively improved due to suppressing a rise in the boiling point of the coolant 42 in the evaporator 12 and securing the evaporation rate of the coolant 42.

Moreover, the pressure regulation mechanism 20 is configured with a mechanical structure including the vessel 52, the diaphragm 54, the valve 56, and the pressure transmission duct 58. Accordingly, reliability can be improved, and the structure can be simplified, in comparison to, for example, an electrical structure including a pressure sensor that detects the pressure inside the evaporator 12, and a solenoid valves or the like that is actuated according to signals output from the pressure sensor.

Moreover, in the pressure regulation mechanism 20, the diaphragm 54 is employed to form a wall of the pressure-actuation space 60, as a member to transmit the pressure inside the pressure-actuation space 60 to the valve 56. The structure of the pressure regulation mechanism 20 can thus be configured more simply, since the pressure inside the pressure-actuation space 60 can be transmitted to the valve 56 by a simple structure.

Moreover, the pressure-actuation space 60 is provided independently of the vapor path 36 and the liquid path 38 (see FIG. 2). Vapor flowing from inside the evaporator 12 into the pressure-actuation space 60 through the pressure transmission path 66 can thereby be suppressed from interfering with vapor flowing from inside the evaporator 12 to the vapor path 36 through the inlet port 36A of the vapor path 36. Accordingly, vapor flowing from inside the evaporator 12 to the vapor path 36 through the inlet port 36A of the vapor path 36 can be made to flow smoothly toward the condenser 14 side.

Moreover, the valve 56 is provided to the inlet port 36A of the vapor path 36 as an example of being at "an end portion on the evaporator side of the vapor path". Accordingly, since the valve 56 is disposed at a position closer to the evaporator 12, when the opening amount of the valve 56 has been increased, the pressure inside the evaporator 12 can be rapidly lowered. This thereby enables the responsiveness of pressure reduction to be raised.

Next, explanation follows regarding modified examples of the first exemplary embodiment.

In the first exemplary embodiment described above, the pressure regulation mechanism 20 includes the elastic member 68. However, for example, the elastic member 68 may be omitted in cases in which the diaphragm 54 has sufficient elastic force.

Moreover, although the valve 56 is preferably provided at the inlet port 36A of the vapor path 36, the valve 56 may be provided at any location on the vapor path 36. Moreover, the valve 56 may be provided on the liquid path 38 rather than on the vapor path 36. In cases in which the valve 56 is provided on the liquid path 38, the flow resistance of the circulation path can be reduced when the opening amount of the valve 56 has increased accompanying a pressure increase inside the evaporator 12, thereby enabling pressure inside the evaporator 12 to be released. Similarly to as described above, vapor can be suppressed from lingering inside the evaporator 12, thereby enabling an excessive rise in pressure inside the evaporator 12 to be suppressed. Valves 56 may also be provided on both the vapor path 36 and the liquid path 38.

Figure 4:
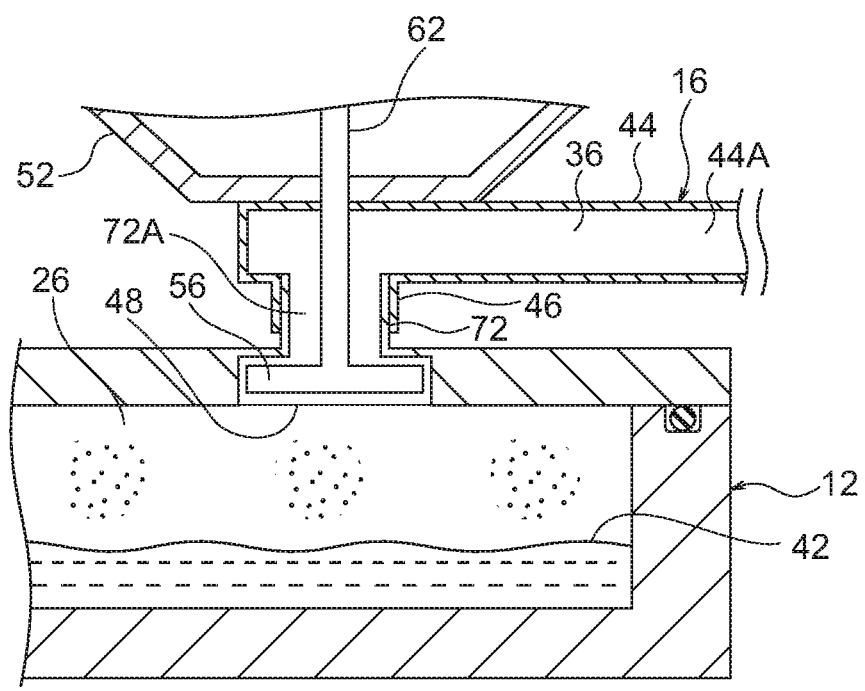
FIG. 4 is a cross-section illustrating a first modified example of a vapor tube according to the first exemplary embodiment.
Figure 5:
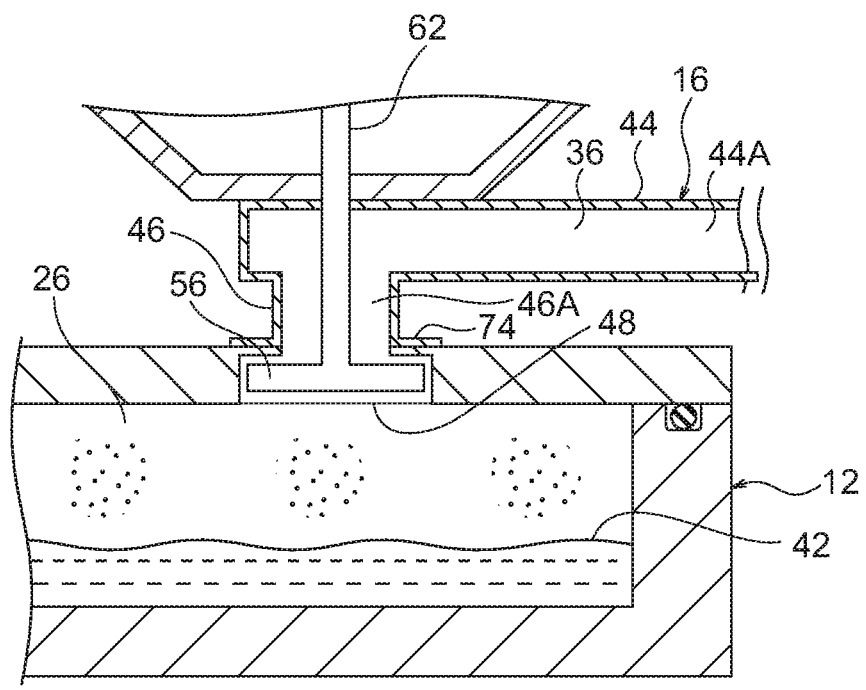
FIG. 5 is a cross-section illustrating a second modified example of a vapor tube according to the first exemplary embodiment.

In the first exemplary embodiment described above, the end portion on the evaporator 12 side of the vapor tube 16 is formed with the connecting portion 46 extending out toward a radial direction outside of the general portion 44, and the connecting portion 46 is press-fitted into the connection hole 48 formed in the upper wall of the evaporator 12. However, for example, as illustrated in FIG. 4, a circular tube shaped connected-to portion 72 projecting out from the evaporator 12 may be integrally formed to the evaporator 12, and the connecting portion 46 of the vapor tube 16 may, for example, be connected by being fitted onto the circular tube shaped connected-to portion 72. Moreover, as illustrated in FIG. 5, for example, a leading end portion of the connecting portion 46 may be formed with a flange 74, and the flange 74 may be joined to the upper wall of the evaporator 12 at the periphery of the connection hole 48.

Moreover, in the first exemplary embodiment described above, the vapor path 36 is formed spanning from one end to the other end of the vapor tube 16. However, for example, as illustrated in FIG. 4, the vapor path 36 may be formed spanning from a path 72A inside the connection hole 48 formed in the evaporator 12 and the connected-to portion 72, to a path 44A inside the general portion 44 formed to the vapor tube 16. Moreover, for example, as illustrated in FIG. 5, the vapor path 36 may be formed spanning from a path 46A inside the connection hole 48 formed in the evaporator 12 and the connecting portion 46, to a path 44A inside the general portion 44 of the vapor tube 16.

Moreover, similarly to the vapor path 36 described above, the liquid path 38 may also be formed spanning from a path formed in the liquid tube 18 to a path or hole formed in the evaporator 12.

Moreover, in cases in which the inlet port of the vapor path 36 and the outlet port of the liquid path 38 are formed on the evaporator 12 side as described above, the valve 56 described above may be disposed at the inlet port of the vapor path 36 or at the outlet port of the liquid path 38 formed on the evaporator 12 side.

Moreover, the pathway section 34 is formed by the vapor tube 16 and the liquid tube 18 that are configured by ducts. However, for example, the pathway section 34 may be formed by a block shaped or plate shaped pathway member including the vapor path 36 and the liquid path 38 internally. Moreover, the evaporator 12, the condenser 14, and the pathway section 34 may be formed integrally to each other rather than being formed as separate members.

Moreover, the pressure transmission path 66 is formed in the pressure transmission duct 58. However, for example, the pressure transmission path 66 may be formed through a block shaped or plate shaped pathway member together with the vapor tube 16 and the liquid tube 18 described above.

Moreover, the pressure transmission section 70 may utilize pressure transmitted from inside the evaporator 12 through the pressure transmission path 66 to increase the opening amount of the valve 56 accompanying the increase in pressure using a configuration with a structure other than that described above.

Moreover, instead of the pressure transmission section 70, a pressure sensor that detects the pressure inside the evaporator 12, a driver section that drives the valve 56, and a controller may be employed as an example of a "pressure regulation section". The driver section may then be controlled by the controller according to increases in pressure inside the evaporator 12 detected by the pressure sensor so as to increase the opening amount of the valve 56.

Moreover, the meandering condensation flow path 28 is formed inside the condenser 14. However, the condensation flow path 28 does not have to meander. A chamber shaped condensation chamber may be formed inside the condenser 14 instead of a long, thin flow path.

Moreover, as illustrated in FIG. 2, the evaporator 12 and the condenser 14 are disposed alongside one another in the horizontal direction. However, the evaporator 12 and the condenser 14 may be disposed alongside one another in a vertical direction.

Moreover, the condenser 14 is disposed at a slightly higher position than the evaporator 12 in the vertical direction. However, the condenser 14 and the evaporator 12 may be disposed at the same height as each other in the vertical direction.

Moreover, in the cooling apparatus 10, the coolant 42 circulates naturally between the evaporator 12 and the condenser 14 without the use of a pump. However, a pump may be provided to at least one out of the vapor tube 16 or the liquid tube 18, and motive force of the pump may be utilized to circulate the coolant 42 between the evaporator 12 and the condenser 14.

Moreover, the electronic component 144 that is a cooling target of the cooling apparatus 10 is, as an example, configured by a Central Processing Unit (CPU). However, configuration may be made with a semiconductor device other than a CPU.

Moreover, the cooling target of the cooling apparatus 10 is preferably the electronic component 144. However, the cooling target of the cooling apparatus 10 may be configured by a heat generating body other than the electronic component 144.

Moreover, the cooling apparatus 10 is preferably mounted to the electronic device 140. However, the cooling apparatus 10 may be mounted to components other than the electronic device 140.

Moreover, the electronic device 140 is preferably configured by a server. However, the electronic device 140 may be configured by a device other than a server.

Note that the plural modified examples described above may be implemented in appropriate combinations of such modified examples as can be combined.

Second Exemplary Embodiment

Next, explanation follows regarding a second exemplary embodiment of technology disclosed herein.

In a cooling apparatus 80 of the second exemplary embodiment illustrated in FIG. 6, the structure of the pressure regulation mechanism 20 is modified in the following manner from that of the cooling apparatus 10 of the first exemplary embodiment (see FIG. 1 to FIG. 3) described above. Namely, in the second exemplary embodiment, the pressure regulation mechanism 20 includes a housing section 82 and a valve 86 in addition to the pressure transmission duct 58.

The housing section 82 is formed between the connecting portion 46 and the general portion 44 of the vapor tube 16. The housing section 82 is formed such that a portion of the vapor tube 16 that is between the connecting portion 46 and the general portion 44 is enlarged toward the upper side. The connecting portion 46 is positioned at a central portion of a bottom wall of the housing section 82.

The valve 86 is formed by a diaphragm. The diaphragm forming the valve 86 is, for example, formed from a material having a rubber-like elasticity. The valve 86 is provided above the inlet port 36A of the vapor path 36, this being an example of being at "an end portion on the evaporator side of the vapor path". The valve 86 is formed in a tapered shape forming a protrusion toward the inlet port 36A side of the vapor path 36.

The valve 86 is provided at a height direction central portion of the housing section 82, and partitions a space inside the housing section 82 into upper and lower parts. Out of an upper side space and a lower side space inside the housing section 82 partitioned by the valve 86, the lower side space configures a pressure-actuation space 90.

The pressure-actuation space 90 is formed as part of the vapor path 36 and connects the inlet port 36A of the vapor path 36 and the path 44A inside the general portion 44 together. Namely, vapor expelled from the evaporation chamber 26 flows into the path 44A inside the general portion 44 through the inlet port 36A of the vapor path 36 and the pressure-actuation space 90. An upper side wall of the pressure-actuation space 90 is formed by the diaphragm forming the valve 86.

One end of the pressure transmission duct 58 is press-fitted into the connection hole 64 formed in the upper wall of the evaporator 12, similarly to in the first exemplary embodiment. The other end of the pressure transmission duct 58, however, passes through a lower portion of a side wall of the housing section 82 and is inserted into the pressure-actuation space 90. More specifically, the other end of the pressure transmission duct 58 is positioned on the opposite side of the inlet port 36A of the vapor path 36 to the general portion 44.

The other end of the pressure transmission duct 58 is bent toward the general portion 44. An outlet port 66B of the pressure transmission path 66 is formed inside the other end of the pressure transmission duct 58. The outlet port 66B of the pressure transmission path 66 faces in the direction of flow of the coolant 42 in the vapor path 36 (a direction heading from the pressure-actuation space 90 toward the path 44A inside the general portion 44).

In the second exemplary embodiment, the pressure transmission duct 58 and the housing section 82 described above form a pressure transmission section 100. The pressure transmission section 100 is an example of a "pressure regulation section". The pressure transmission section 100 is configured with a structure that utilizes pressure transmitted from inside the evaporator 12 to regulate the opening amount of the valve 86 in the manner explained below.

Figure 6:
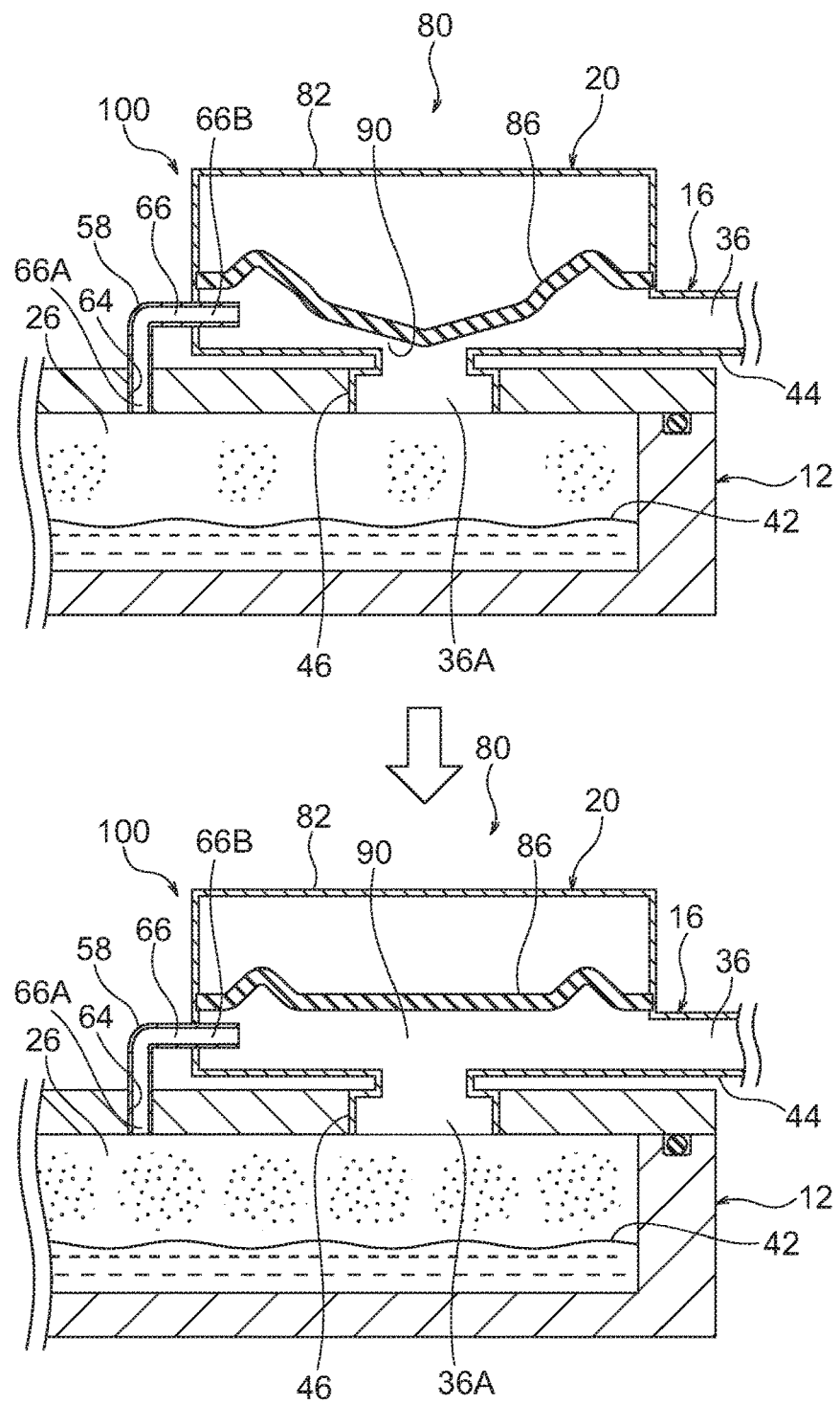
FIG. 6 is a diagram to explain configuration and operation of a pressure regulation mechanism according to a second exemplary embodiment.

Namely, as illustrated in the upper part of FIG. 6, when the diaphragm forming the valve 86 is in a free state, a central leading end portion of the valve 86 faces the inlet port 36A of the vapor path 36. The opening amount of the valve 86 is small in the state in which the central leading end portion of the valve 86 faces the inlet port 36A of the vapor path 36.

On the other hand, as illustrated in the lower part of FIG. 6, in a state in which the pressure inside the evaporator 12 has increased, and the pressure transmitted from inside the evaporator 12 to the pressure-actuation space 90 through the pressure transmission path 66 has increased, the valve 86 formed from the diaphragm is elastically deformed toward the upper side. In a state in which the valve 86 has been elastically deformed toward the upper side, the central leading end portion of the valve 86 is moved upward and away from the inlet port 36A of the vapor path 36, increasing the opening amount of the valve 86.

In this manner, in the second exemplary embodiment, the pressure transmission section 100 is configured with a structure that utilizes pressure transmitted from inside the evaporator 12 through the pressure transmission path 66 to increase the opening amount of the valve 86 accompanying the increase in pressure. Accordingly, when the pressure inside the evaporator 12 has become high, the pressure inside the evaporator 12 is released by increasing the opening amount of the valve 86, thereby enabling vapor to be suppressed from lingering inside the evaporator 12. Since an excessive rise in pressure inside the evaporator 12 is suppressed, the boiling point of the coolant 42 in the evaporator 12 can be suppressed from rising. The evaporation rate of the coolant 42 can be secured as a result, thereby enabling the cooling performance of the cooling apparatus 80 to be improved.

Moreover, the pressure-actuation space 90 is formed on part of the vapor path 36. The vapor path 36 formed with the pressure-actuation space 90, and the evaporation chamber 26, are placed in communication with each other through the pressure transmission path 66. Accordingly, in a state in which the pressure inside the evaporator 12 has increased, vapor moves from the evaporation chamber 26 to the vapor path 36 through the pressure transmission path 66 as well as through the inlet port 36A of the vapor path 36. This further promotes expulsion of vapor from inside the evaporator 12, thereby enabling an excessive rise in pressure inside the evaporator 12 to be even more effectively suppressed.

Moreover, the outlet port 66B of the pressure transmission path 66 faces in the direction of flow of the coolant 42 in the vapor path 36 as described above. Accordingly, vapor from inside the evaporator 12 flowing into the pressure-actuation space 90 through the pressure transmission path 66 can be merged smoothly with the flow of vapor from inside the evaporator 12 flowing into the vapor path 36 through the inlet port 36A of the vapor path 36. This thereby enables the vapor in the vapor path 36 to flow smoothly toward the condenser 14 side.

Moreover, the pressure regulation mechanism 20 is configured with a mechanical structure including the pressure transmission duct 58, the housing section 82, and the valve 86. Accordingly, reliability can be improved and the structure can be simplified in comparison, for example, to an electrical structure including a pressure sensor that detects the pressure inside the evaporator 12, and a solenoid valve or the like that is actuated according to signals output from the pressure sensor.

Moreover, in the pressure regulation mechanism 20, the diaphragm that forms a wall of the pressure-actuation space 90 and that deforms under the pressure inside the pressure-actuation space 90 functions as the valve 86. An increase in the number of members can accordingly be suppressed, thereby enabling the structure of the pressure regulation mechanism 20 to be further simplified.

Moreover, the valve 86 is provided above the inlet port 36A of the vapor path 36 as an example of being at "an end portion on the evaporator side of the vapor path". Accordingly, since the valve 86 is disposed at a position closer to the evaporator 12, when the opening amount of the valve 86 is increased, the pressure inside the evaporator 12 can be rapidly lowered. This thereby enables the responsiveness of pressure reduction to be raised.

Note that in the second exemplary embodiment, modified examples similar to those of the first exemplary embodiment may be adopted for structures similar to those in the first exemplary embodiment described above.

Moreover, the pressure transmission section 100 may utilize pressure transmitted from inside the evaporator 12 through the pressure transmission path 66 to increase the opening amount of the valve 86 accompanying the increase in pressure using a configuration with a structure other than that described above.

Moreover, instead of the pressure transmission section 100, a pressure sensor that detects the pressure inside the evaporator 12, a driver section that drives the valve 86, and a controller may be employed as an example of a "pressure regulation section". The driver section may then be controlled by the controller according to increases in pressure inside the evaporator 12 detected by the pressure sensor so as to increase the opening amount of the valve 86.

Third Exemplary Embodiment

Next, explanation follows regarding a third exemplary embodiment of technology disclosed herein.

In a cooling apparatus 110 of the third exemplary embodiment illustrated in FIG. 7, the structure of the pressure regulation mechanism 20 is modified in the following manner from that of the cooling apparatus 10 of the first exemplary embodiment (see FIG. 1 to FIG. 3) described above. Namely, in the third exemplary embodiment, the pressure regulation mechanism 20 includes a housing section 112, a communicating section 114, a valve 116, and an elastic member 118 in addition to the pressure transmission duct 58.

The housing section 112 is formed at a portion of the vapor tube 16 above the connecting portion 46. The housing section 112 is formed such that the portion of the vapor tube 16 above the connecting portion 46 is enlarged toward the upper side. The connecting portion 46 is positioned below the housing section 112. The communicating section 114 has a similar cross-section profile to that of the general portion 44, and extends out from the housing section 112 the opposite side to the general portion 44.

The valve 116 is formed in a spherical shape and is provided at a lower portion of the housing section 112. The inlet port 36A of the vapor path 36 is formed inside the connecting portion 46, and the valve 116 is disposed above the inlet port 36A of the vapor path 36 so as to face the inlet port 36A, as an example of being at "an end portion on the evaporator side of the vapor path".

The elastic member 118 is, for example, a coil spring and is interposed between an upper wall of the housing section 112 and the valve 116. One end of the elastic member 118 is fixed to the valve 116, and the other end of the elastic member 118 is fixed to the upper wall of the housing section 112. A coupling rod 122 is provided at an upper side of the valve 116, and the coupling rod 122 is inserted inside the elastic member 118.

A space between the inlet port 36A of the vapor path 36 and the valve 116 configures a pressure-actuation space 120. The pressure-actuation space 120 is formed on part of the vapor path 36, namely at a portion between a path 44A inside the general portion 44 and the inlet port 36A of the vapor path 36. The valve 116 described above is positioned above the pressure-actuation space 120 and is disposed adjoining the pressure-actuation space 120.

Similarly to in the first exemplary embodiment, one end of the pressure transmission duct 58 is press-fitted into the connection hole 64 formed in the upper wall of the evaporator 12. The other end of the pressure transmission duct 58 passes through a side wall of the communicating section 114 and is inserted into the communicating section 114. The other end of the pressure transmission duct 58 is, more specifically, positioned on the opposite side of the valve 116 to the general portion 44.

Moreover, the other end of the pressure transmission duct 58 is bent toward the general portion 44. The outlet port 66B of the pressure transmission path 66 is formed inside the other end of the pressure transmission duct 58. The outlet port 66B of the pressure transmission path 66 faces in the direction of flow of the coolant 42 in the vapor path 36 (a direction from the pressure-actuation space 120 toward the path 44A inside the general portion 44).

In the third exemplary embodiment, the pressure transmission duct 58, the housing section 112, the communicating section 114, and the elastic member 118 described above form a pressure transmission section 130. The pressure transmission section 130 is an example of a "pressure regulation section". The pressure transmission section 130 is configured with a structure that utilizes pressure transmitted from inside the evaporator 12 to regulate the opening amount of the valve 116 in the following manner.

Figure 7:
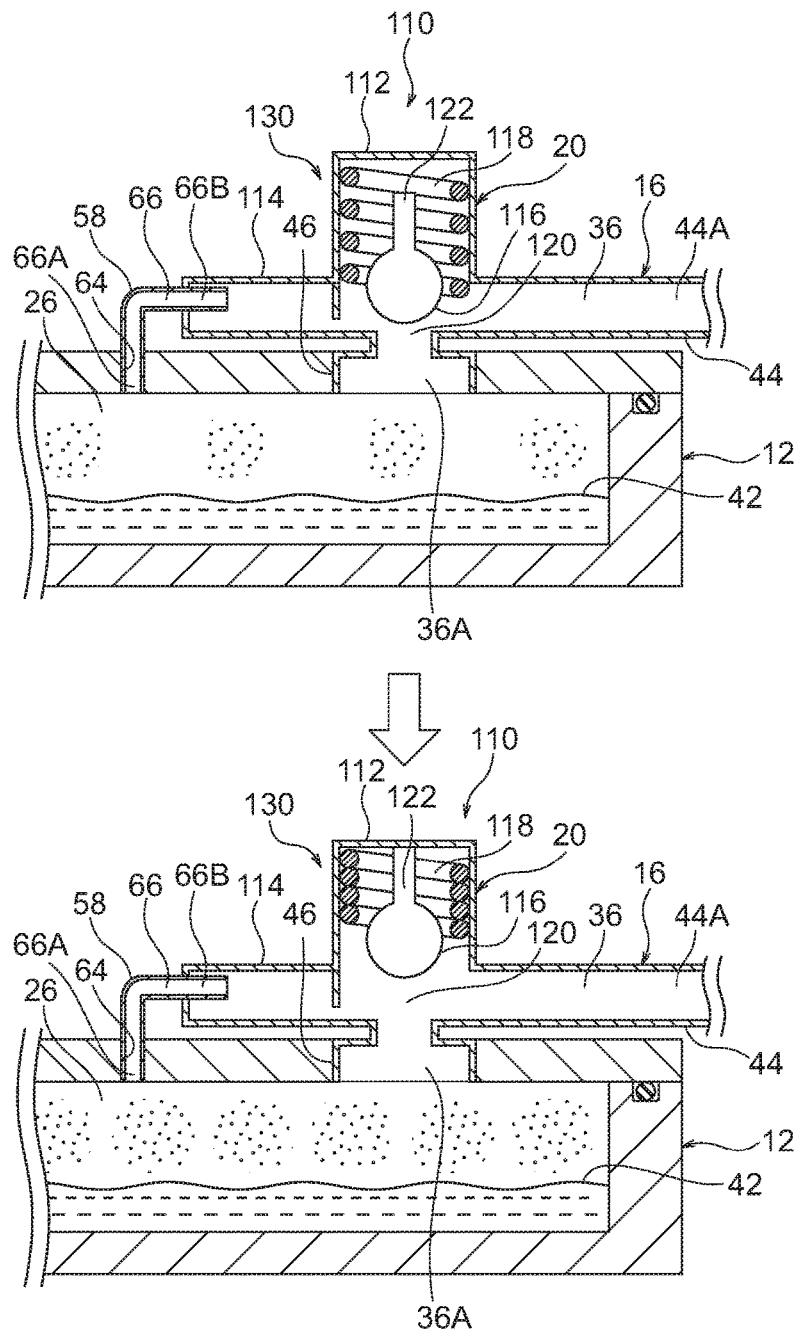
FIG. 7 is a diagram to explain configuration and operation of a pressure regulation mechanism according to a third exemplary embodiment.

Namely, as illustrated in the upper part of FIG. 7, when the elastic member 118 is in a free state, the valve 116 faces the inlet port 36A of the vapor path 36. The opening amount of the valve 116 is small in the state in which the valve 116 faces the inlet port 36A of the vapor path 36.

On the other hand, as illustrated in the lower part of FIG. 7, in a state in which the pressure inside the evaporator 12 has increased, and the pressure transmitted from inside the evaporator 12 to the pressure-actuation space 120 through the pressure transmission path 66 has increased, the valve 116 is moved toward the upper side against the elastic force of the elastic member 118. In a state in which the valve 116 has been moved toward the upper side, the valve 116 is moved upward and away from the inlet port 36A of the vapor path 36, increasing the opening amount of the valve 116.

In this manner, in the third exemplary embodiment, the pressure transmission section 130 is configured with a structure that utilizes pressure transmitted from inside the evaporator 12 through the pressure transmission path 66 to increase the opening amount of the valve 116 accompanying the increase in pressure. Accordingly, when the pressure inside the evaporator 12 has become high, the pressure inside the evaporator 12 is released by increasing the opening amount of the valve 116, thereby enabling vapor to be suppressed from lingering inside the evaporator 12. Since an excessive rise in pressure inside the evaporator 12 is suppressed, the boiling point of the coolant 42 in the evaporator 12 can be suppressed from rising. The evaporation rate of the coolant 42 can be secured as a result, thereby enabling the cooling performance of the cooling apparatus 110 to be improved.

Moreover, the pressure-actuation space 120 is formed on part of the vapor path 36. The evaporation chamber 26 and the vapor path 36 formed with the pressure-actuation space 120 are placed in communication with each other by the pressure transmission path 66. Accordingly, in a state in which the pressure inside the evaporator 12 has increased, vapor moves from the evaporation chamber 26 to the vapor path 36 through the pressure transmission path 66 as well as through the inlet port 36A of the vapor path 36. This further promotes expulsion of vapor from inside the evaporator 12, thereby enabling an excessive rise in pressure inside the evaporator 12 to be even more effectively suppressed.

Moreover, the outlet port 66B of the pressure transmission path 66 faces in the direction of flow of the coolant 42 in the vapor path 36 as described above. Accordingly, vapor from inside the evaporator 12 flowing into the pressure-actuation space 120 through the pressure transmission path 66 can be merged smoothly with the flow of vapor from inside the evaporator 12 flowing into the vapor path 36 through the inlet port 36A of the vapor path 36. This thereby enables the vapor in the vapor path 36 to flow smoothly toward the condenser 14 side.

Moreover, the pressure regulation mechanism 20 is configured with a mechanical structure including the pressure transmission duct 58, the housing section 112, the communicating section 114, the valve 116, and the elastic member 118. Accordingly, reliability can be improved and the structure can be simplified, in comparison, for example, to an electrical structure including a pressure sensor that detects the pressure inside the evaporator 12, and solenoid valve or the like that is actuated according to signals output from the pressure sensor.

Moreover, in the pressure regulation mechanism 20, the valve 116 is provided adjoining the pressure-actuation space 120, and the valve 116 is moved directly by the pressure inside the pressure-actuation space 120. An increase in the number of members can accordingly be suppressed, thereby enabling the structure of the pressure regulation mechanism 20 to be further simplified.

Moreover, the valve 116 is disposed above the inlet port 36A of the vapor path 36 so as to face the inlet port 36A as an example of being at "an end portion on the evaporator side of the vapor path". Accordingly, since the valve 116 is disposed at a position closer to the evaporator 12, when the opening amount of the valve 116 is increased, the pressure inside the evaporator 12 can be rapidly lowered. This thereby enables the responsiveness of pressure reduction to be raised.

Note that in the third exemplary embodiment, modified examples similar to those of the first exemplary embodiment may be adopted for structures similar to those in the first exemplary embodiment described above.

Moreover, the pressure transmission section 130 may utilize pressure transmitted from inside the evaporator 12 through the pressure transmission path 66 to increase the opening amount of the valve 116 accompanying the increase in pressure using a configuration with a structure other than that described above.

Moreover, instead of the pressure transmission section 130, a pressure sensor that detects the pressure inside the evaporator 12, a driver section that drives the valve 116, and a controller may be employed as an example of a "pressure regulation section". The driver section may then be controlled by the controller according to increases in pressure inside the evaporator 12 detected by the pressure sensor so as to increase the opening amount of the valve 116.

Explanation of the technology disclosed herein has been given regarding the first to the third exemplary embodiments. However, the technology disclosed herein is not limited to the above, and obviously various other modifications may be implemented within a range not departing from the spirit of the technology disclosed herein.

All cited documents, patent applications and technical standards mentioned in the present specification are incorporated by reference in the present specification to the same extent as if the individual cited documents, patent applications and technical standards were specifically and individually incorporated by reference in the present specification.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling apparatus, comprising:
   an evaporator in which a coolant is housed and that evaporates the coolant;
   a condenser that condenses the coolant evaporated by the evaporator;
   a pathway section that includes a vapor path and a liquid path each placing an inside of the evaporator and an inside of the condenser in communication with each other, and that circulates the coolant between the evaporator and the condenser;
   a valve that is provided to at least one path out of the vapor path or the liquid path; and
   a pressure transmission section that includes a pressure transmission path in communication with the inside of the evaporator, and that includes a pressure-actuation space formed on a part of the vapor path and in communication with the inside of the evaporator through the pressure transmission path, the pressure transmission section increases an opening amount of the valve as a pressure in the pressure-actuation space increases.

2. The cooling apparatus of claim 1, wherein the valve is a diaphragm forming a wall of the pressure-actuation space.

3. The cooling apparatus of claim 1, wherein the valve is provided adjoining the pressure-actuation space.

4. The cooling apparatus of claim 1, wherein an outlet port of the pressure transmission path faces in a direction of flow of the coolant in the vapor path.

5. The cooling apparatus of claim 1, wherein the valve is provided at an end portion on the evaporator side of the vapor path.

6. The cooling apparatus of claim 1, wherein the pressure transmission section includes a pressure transmission duct through which the pressure transmission path is formed.

7. The cooling apparatus of claim 1, wherein an inlet port area of the pressure transmission path is smaller than an inlet port area of the vapor path.

8. An electronic device, comprising:
   an electronic component that is a heat generating body;
   an evaporator that is in thermal contact with the electronic component, in which a coolant is housed, and that evaporates the coolant using heat from the electronic component;
   a condenser that condenses the coolant;
   a pathway section that includes a vapor path and a liquid path each placing an inside of the evaporator and an inside of the condenser in communication with each other, and that circulates the coolant between the evaporator and the condenser;
   a valve that is provided to at least one path out of the vapor path or the liquid path; and
   a pressure transmission section that includes a pressure transmission path in communication with the inside of the evaporator, and that includes a pressure-actuation space formed on a part of the vapor path and in communication with the inside of the evaporator through the pressure transmission path, the pressure transmission section increases an opening amount of the valve as a pressure in the pressure-actuation space increases.

* * * * *